(12) United States Patent  
Chang

(10) Patent No.: US 9,002,498 B2
(45) Date of Patent: Apr. 7, 2015

(54) TOOL FUNCTION TO IMPROVE FAB PROCESS IN SEMICONDUCTOR MANUFACTURING

(75) Inventor: Yung-Cheng Chang, Singapore (SG)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 479 days.

(21) Appl. No.: 13/364,503

(22) Filed: Feb. 2, 2012

(65) Prior Publication Data

US 2013/0204418 A1   Aug. 8, 2013

(51) Int. Cl.
*G05B 13/02* (2006.01)
*G06F 19/00* (2011.01)
*G05B 19/418* (2006.01)
*H01L 21/66* (2006.01)

(52) U.S. Cl.
CPC  *G05B 19/41875* (2013.01); *G05B 2219/45031* (2013.01); *H01L 22/12* (2013.01)

(58) Field of Classification Search
CPC ............................................. G05B 2219/45031
USPC ............................. 700/29, 31, 32, 51, 52, 121
See application file for complete search history.

(56) References Cited

U.S. PATENT DOCUMENTS

| | | | | |
|---|---|---|---|---|
| 6,055,460 | A * | 4/2000 | Shopbell | 700/121 |
| 6,587,744 | B1 * | 7/2003 | Stoddard et al. | 700/121 |
| 6,594,589 | B1 * | 7/2003 | Coss et al. | 702/34 |
| 6,698,009 | B1 * | 2/2004 | Pasadyn et al. | 700/109 |
| 6,751,519 | B1 * | 6/2004 | Satya et al. | 700/121 |
| 6,895,295 | B1 * | 5/2005 | Grover et al. | 700/121 |
| 6,917,849 | B1 * | 7/2005 | Pasadyn et al. | 700/121 |
| 6,947,803 | B1 * | 9/2005 | Bode et al. | 700/121 |
| 6,950,716 | B2 * | 9/2005 | Ward et al. | 700/121 |
| 6,988,017 | B2 * | 1/2006 | Pasadyn et al. | 700/121 |
| 7,050,879 | B1 * | 5/2006 | Wang et al. | 700/121 |
| 7,144,297 | B2 * | 12/2006 | Lin et al. | 451/5 |
| 7,167,766 | B2 * | 1/2007 | Lam et al. | 700/96 |
| 7,198,964 | B1 * | 4/2007 | Cherry et al. | 438/14 |
| 7,383,521 | B2 * | 6/2008 | Smith et al. | 716/114 |
| 8,017,411 | B2 * | 9/2011 | Sonderman et al. | 438/14 |
| 8,073,667 | B2 | 12/2011 | Strang et al. | |
| 8,437,870 | B2 * | 5/2013 | Tsai et al. | 700/110 |
| 2004/0060659 | A1 | 4/2004 | Morioka et al. | |
| 2005/0071035 | A1 | 3/2005 | Strang | |
| 2005/0071038 | A1 | 3/2005 | Strang | |
| 2010/0312374 | A1 * | 12/2010 | Tsai et al. | 700/110 |

FOREIGN PATENT DOCUMENTS

| | | | |
|---|---|---|---|
| JP | 2004119753 | A | 4/2004 |
| KR | 20060116192 | A | 11/2006 |

* cited by examiner

*Primary Examiner* — Ronald Hartman, Jr.
(74) *Attorney, Agent, or Firm* — Eschweiler & Associates, LLC

(57) ABSTRACT

The present disclosure relates to a process tool system that utilizes tool sensor data and an embedded or built-in tool model to facilitate semiconductor fabrication. The process tool system includes a sensor data component, the tool model, and an execution system. The sensor data component is configured to provide the tool sensor data. The tool model is built in a process tool and is configured to generate model outputs based on model inputs. The manufacturing execution system is configured to provide tool process data, including actual metrology and previous process data, to the sensor data component. Additionally, the execution system provides the model inputs to the tool model and receives the model outputs from the tool model. The execution system provides one or more execution system outputs based on the sensor data and the model outputs. The sensor data can include measured semiconductor device characteristics.

20 Claims, 3 Drawing Sheets

TOOL FUNCTION TO IMPROVE FAB PROCESS IN SEMICONDUCTOR MANUFACTURING

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

The various processing steps fall into a number of categories including deposition, removal, patterning, and modification of electrical properties (i.e., doping). Each step of the fabrication process is performed with input parameters selected to yield desired device characteristics for that step. Problems can occur when variations in input parameters, variations in process tools, and the like result in characteristics that deviate from the desired characteristics. These deviations can lead to lowered performance, premature failures, and/or failed devices.

DETAILED DESCRIPTION

Figure 1:
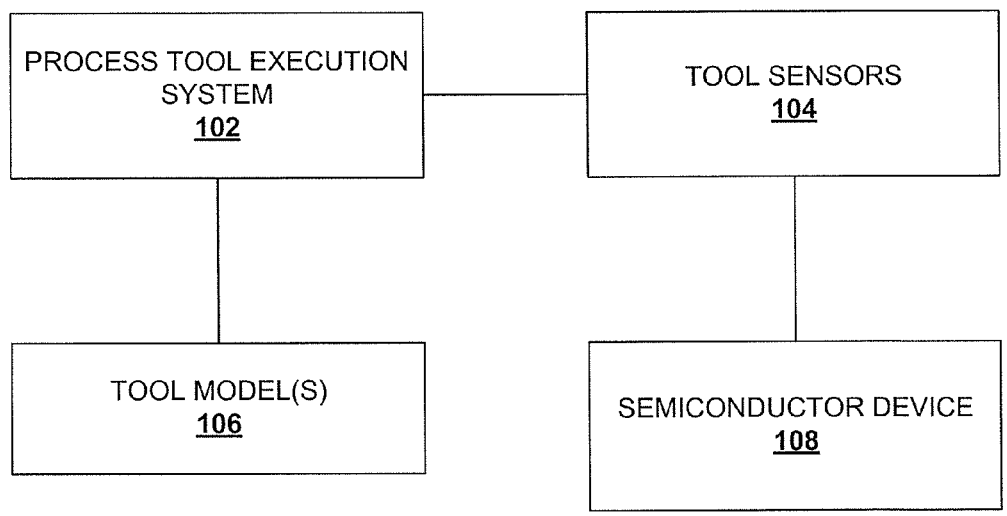
FIG. 1 is a block diagram illustrating a process tool system in accordance with an embodiment of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Generally, semiconductor fabrication involves performing a relatively large number or process steps on a wafer or semiconductor material in order to produce a desired semiconductor integrated circuit. The fabrication process is a multiple-step sequence of photolithographic and chemical processing steps during which electronic circuits are gradually created on a wafer composed of a semiconducting material.

The process steps can be broken down into front end of line (FEOL) processing and back end of line (BEOL) processing. In one example, over 300 sequenced process steps are required to form an integrated circuit on a semiconductor wafer.

The various processing steps fall into a number of categories including deposition, removal, patterning, and modification of electrical properties (i.e., doping). Deposition is a process that grows, coats, or otherwise transfers a material onto the wafer. Some examples of deposition processes or techniques in clued physical vapour deposition (PVD), chemical vapour deposition (CVD), electrochemical deposition (ECD), molecular beam epitaxy (MBE) atomic layer deposition (ALD) and the like. Removal is a process that removes material from the wafer in bulk or selectively and includes etching processes. For example, chemical mechanical planarization (CMP) is a typical removal process used between levels of a device. Patterning processes are those that shape or later the shape of deposited materials. Patterning can also be referred to as lithography. A typical patterning process includes using a photoresist material to selectively mask portions of the semiconductor device, exposing the device to a particular wavelength of light, and then washing away the unexposed regions with a developer solution. Electrical properties are altered by doping selected regions by diffusion and/or ion implantation. The processes are typically followed by an anneal process, such as a furnace anneal or rapid thermal anneal (RTA) in order to activate the implanted dopants.

Various approaches are used to identify errors during fabrication. Semiconductor devices or wafers are typically tested at the end of production in a wafer acceptance test. However, the wafer production cycle time is very long, e.g., 6-8 weeks or more, and process steps could encounter out of control (OOC) fabrication events or errors that impact the product yield. Thus, an OOC event could occur and not be discovered until after many process steps have been performed.

Some semiconductor fabrication processes have introduced in-line and off line monitoring to facilitate process control and product yield. However, the typical monitoring only covers a small number of parameters and steps of a fabrication process, therefore there is still a risk to product yield.

The fabrication processes are performed by semiconductor fabrication tools or process tools. Some of these process tools incorporate fault detection and classification (FDC) software and controls to identify faults earlier in the process. However, the number and types of sensors used are limited and the FDC can miss data and fail to identify faults.

Semiconductor fabrication facilities, also referred to as FABS, can also incorporate fabrication based modeling, also referred to as virtual metrology (VM), in order to model fabrication processes and predict outcomes of fabrication processes. However, these models can fail to account for variations in process tools, tool behavior and other parameters. As a result, the models can fail to adequately predict process results.

The present disclosure utilizes tool built-in sensors and built-in prediction models to predict and/or identify faults or events after all or selected fabrication steps. The tool based sensors and models are embedded or built into semiconductor fabrication tools. The embedded or built in tool sensors provide tool sensor data that can be used to update and/or adjust tool embedded or built in models. The embedded or built in models can vary according to specific tool behaviour and therefore more accurate at predicting results. As a consequence, faults and events can be more accurately and easily identified. Furthermore, input parameters for processes can be adjusted to mitigate the occurrence of faults and events. Thus, the embedded tool model provides a more accurate prediction of wafer process performance data.

FIG. 1 is a block diagram illustrating a process tool system 100 in accordance with an embodiment of the disclosure. The system 100 utilizes tool sensor data and embedded tool prediction models to facilitate semiconductor fabrication and predict and mitigate the occurrence of faults and events. Further, the tool sensor data and the built-in tool prediction models also facilitate the prediction of wafer process performance data.

The system 100 includes a process tool control or execution system 102, tool sensors 104, tool models 106 and operates on a semiconductor device 108. The process tool control 102 performs a step of a semiconductor fabrication process. The step can include processes including, but not limited to, deposition, removal, patterning, and modification of electrical properties. The process tool control 102 controls various input parameters that are selected to yield desired device characteristics and properties for the semiconductor device. For example, an etch rate and etch time are input parameters for an etch process to yield a selected amount of etched material or remaining thickness. A planarization process, as another example, has a chemical solution and time as a thickness to yield a remaining thickness and uniformity.

The tool sensors 104 obtain sensor measurements at various times during the step of the fabrication process including before, during and after performing the step. Examples of the sensor measurement include initial thickness, temperature, and the like. The sensor measurements are provided to the process tool control 102.

The tool models 106 predict semiconductor device features based on inputs or input parameters. The tool models 106 are virtual models in that they do not require a physical manifestation and can be computer generated. The models 106 can be for specific steps and/or for an entire fabrication process. The predicted features include, for example, dopant distribution, stress distribution, device geometry, and the like. The inputs to the models include, for example, process flow, layout, desired behaviours, desired properties, tool specific behaviours/properties and the like. It is appreciated that tool specific properties can vary among tools for a variety of reasons including generation of tool, varied manufacturers, physical size requirements and the like. The tool specific properties include, for example, sensitivity to temperature, sensitivity to pressure, flow rates and the like.

The outputs of the tool models 106 include process step parameters, predicted characteristics, predicted faults or events (including OOC), and the like. Additionally, the outputs can also include a confidence level that indicates a confidence that the predicted characteristics will be obtained given the tool being used and the current process conditions.

The tool models 106 are also configured to be updatable based on the tool sensor data. The tool sensor data is utilized to identify discrepancies between predicted characteristics and sensor data and, therefore, to improve the accuracy and predictability of the tool models 106.

The process tool control 102 provides the tool input values to the tool models 106 and determines the predicted characteristics and process parameters. The process tool control 102 also utilizes the sensor measurements obtained from the tool sensors 104 in order to update the tool models 106. The process tool control 102 performs the step of the process flow on the semiconductor device utilizing the tool models 106 and the tool sensors 104.

Figure 2:
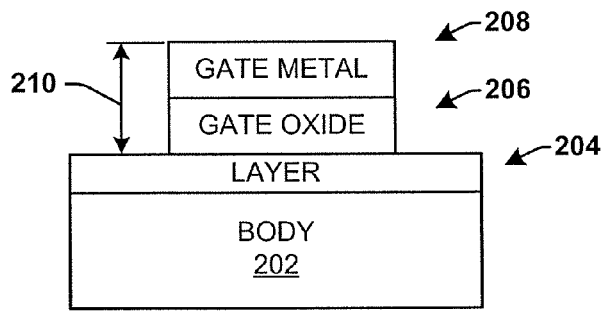
FIG. 2 is a cross sectional view of an example semiconductor device in order to illustrate aspects of the present disclosure.

FIG. 2 is a cross sectional view of an example semiconductor device 200 in order to illustrate aspects of the present disclosure. The device 200 is provided for illustrative purposes and it is appreciated that embodiments of the disclosure are applicable to the fabrication of other types of semiconductor devices.

The device 200 is shown with a semiconductor body 202 or substrate, a first layer 204 on the body 202, a gate oxide layer 206 on a portion of the layer 204, and a gate metal 208 formed on the gate oxide layer 206.

In this example, a process tool has performed a patterning operation or step to yield a gate stack or structure 206 and 208 having a height 210. The step has been performed utilizing tool models and tool sensors, as shown and described above with regard to FIG. 1. The patterning step was performed by providing inputs to a tool model and obtaining process parameters there from. Tool sensors are utilized to measure the height 210. The process tool or controller compared the measure sure height 210 with a predicted height. The comparison can be utilized to identify confidence levels and/or update the tool models.

Figure 3:
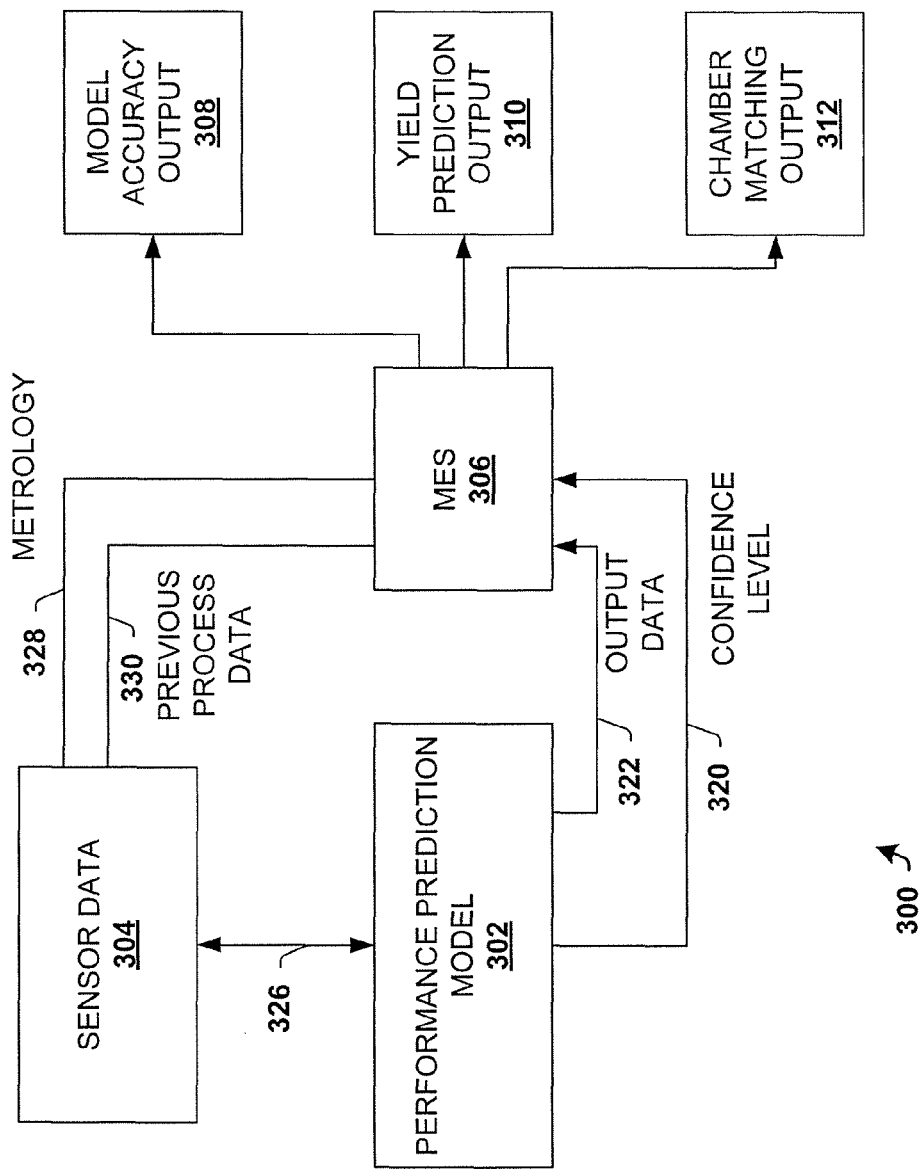
FIG. 3 is a block diagram of a process tool system in accordance with an embodiment of the disclosure.

FIG. 3 is a block diagram of a process tool system 300 in accordance with an embodiment of the disclosure. The system 300 uses built-in tool models and tool sensor data to facilitate semiconductor fabrication and predict and mitigate the occurrence of faults and events. The system 300 can be utilized in conjunction with or instead of the system 100 of FIG. 1 shown above.

The system 300 includes a tool performance prediction model 302, tool sensor data 304, a manufacturing execution system (MES) 306 and provides a model accuracy output 308, a yield prediction output 310, and a chamber matching output 312.

The tool model 302 predicts semiconductor device features and process performance characteristics based on inputs or input parameters. The tool model is a virtual model (VM). The model 302 includes prediction for one or more steps of semiconductor fabrication and includes predicted features. The predicted features include, for example, dopant distribution, stress distribution, device geometry, and the like. The inputs to the model include for example, process flow, layout, desired behaviours, desired properties, tool specific behaviours/properties and the like. It is appreciated that tool specific properties can vary among tools for a variety of reasons including generation of tool, varied manufacturers, physical size requirements and the like. The tool specific properties include, for example, sensitivity to temperature, sensitivity to pressure, flow rates and the like.

It is appreciated that the tool model 302 is developed for a specific tool or class of process tools. Thus, the tool model 302 is built-into process tools, which facilitates modeling of tool specific behavior and facilitates predictions by factoring in the tool specific behaviors. The tool model can be utilized for other tools by taking into account the specific behavior of the other tools, including variations in behavior from the original or base process tool that was used to generate the tool model 302.

The outputs of the tool model 302 include output data 322 and a confidence level 320. The confidence level 320 indicates a confidence for predicted features or characteristics for a given processing step based on the input parameter. The output data 322 includes process step parameters, predicted characteristics, predicted faults or events (including OOC), and the like.

The tool model 302 is also configured to be updatable based on the tool sensor data 304. The tool sensor data 304 is utilized to identify discrepancies between predicted characteristics and sensor data and, therefore, to improve the accuracy and predictability of the tool model 302.

The tool model 302 can also include finite element analysis (FE) and/or finite volume methods (FV). The tool model 302 is developed using a suitable technique, such as by training a neural network, genetic programming and other suitable methods. The tool model 302 can be developed with two and three dimensional characteristics. The tool model 302 incorporates tool specific behaviour that fabrication facilities may not be aware of.

The sensor data 304 is provided to the tool model 302 in order to generate the confidence level 322 and the output data 320. The sensor data 304 includes data for one or more parameters including actual metrology 328 (sampling) of a semiconductor device under fabrication and previous process data 330. The sensor data 304 can be stored in a suitable memory device or structure and is updated over time.

In one example, where the step is a deposition process and the tool is a deposition tool, the sensor data 304 can include thickness and uniformity. In another example, where the step is an etching process and the tool is an etching tool, the sensor data 304 can include a beginning thickness, feature width, and ending thickness. In another example, where the step is a planarization process and the tool is a planarization tool, the sensor data 304 can include remaining thickness and layer uniformity.

The manufacturing execution system (MES) 306 performs one or more semiconductor fabrication steps on a semiconductor device or devices. The MES 306 provides actual metrology 328 and previous process data 330 to the model 302 via the sensor data 304. As inputs, the MES 306 receives the confidence level 322 and the output data 320, described above.

The MES generates one or more outputs based on the confidence level 322, the output data 320, the actual metrology 328 and the previous process data 330. The outputs include, in one example, a model accuracy report 308, a yield prediction output 310, and a chamber matching output 312. it is appreciated that alternate embodiments of the disclosure can omit some or all of the above outputs and include additional outputs.

The model accuracy report 308 is based on a comparison of predicted characteristics (by the model 302) with the sensor data 304. The model accuracy report 308 can be utilized to indicate a defective or inaccurate model, to indicate updating of a model is required, to indicate that the accuracy is acceptable and the like. The yield prediction output 310 is a report that predicts the yield output for the device or devices under fabrication. The yield prediction output 310 can be utilized to identify faults or events that impact yield. The chamber matching output 312 is utilized to identify chambers or tools for process steps. Chambers or tools can have varied behavior and the chamber matching output 312 facilitates selection or matching of chambers or tools for the device or devices based on the model 302 and the sensor data 304.

Figure 4:
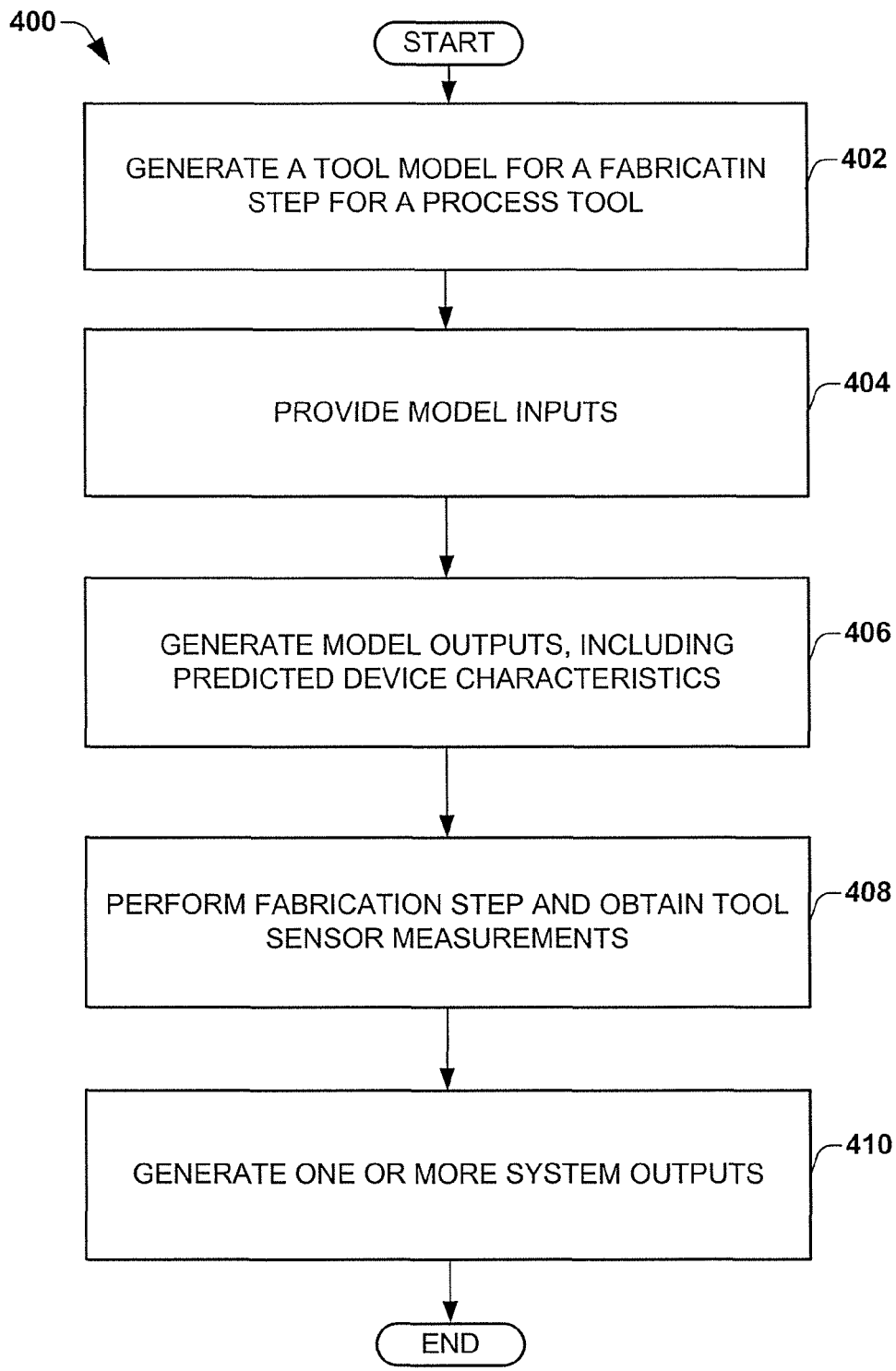
FIG. 4 is a flow diagram illustrating a method of operating a process tool system.

FIG. 4 is a flow diagram illustrating a method 400 of operating a process tool system. The method 400 uses tool models and sensor data in order to facilitate fault identification and device fabrication.

The method begins at block 402, wherein a tool model is generated for a semiconductor fabrication step. The tool model is generated using various inputs including, but not limited to, layout specifications, design specifications, particular tool characteristics, environmental conditions, and the like. The tool model is configured to provide outputs including device characteristics and confidence levels. The fabrication step is a process or step in the fabrication of a particular semiconductor device. For example, the fabrication step can include depositing a layer of material, chemical mechanical planarization, patterning, and the like.

The tool model incorporates behavior for a specific process tool. It is appreciated that the tool model can be utilized for other process tools, but may require modification based on specific behaviors or variations from an original or base process tool that was used to generate the tool model.

Model inputs are provided to the tool model at block 404. The model inputs include, for example, desired device characteristics, process step, process type, operating condition limits, and the like.

Model outputs are generated from the tool model at block 406. The model outputs include, for example, predicted device characteristics or features, process parameters, process duration, confidence levels, and the like.

The semiconductor fabrication step is performed at block 408 and sensor measurements are obtained. The fabrication step is performed at least partially according to the model outputs. The sensor measurements are obtained before, during, and/or after the fabrication step.

One or more system outputs are generated at block 410. The system outputs include, for example, a model accuracy report, a yield prediction report, fault identification reports, and a chamber matching report. The system outputs are generated according to one or more of the sensor measurements, the model inputs, the model outputs, previous process data, and the like.

The model accuracy report provides an accuracy of the tool model according to at least the sensor measurements and the tool model. The yield prediction report predicts a yield for the device being fabricated based on the tool model and the tool sensor data. The fault identification report identifies faults or events that can negatively impact yield or device operating characteristics. The fault identification report can also classify faults or events into categories of severity. The chamber matching report identifies tools, devices or chambers that match further process requirements or steps.

The sensor measurements include device fabrication characteristics such as, but not limited to, feature dimensions, dopant concentrations, dopant profiles, and the like. The sensor measurements can also include fabrication process conditions, such as temperature, pressure, flow rates, and the like. The sensor measurements can identify and incorporate tool specific behavior.

In one example, where the step is a deposition process and the tool is a deposition tool, the sensor measurements can include flow-rate, temperature and deposition time. In another example, where the step is an etching process and the tool is an etching tool, the sensor measurements can include a beginning thickness, temperature, and RF power. In another example, where the step is a planarization process and the tool is a planarization tool, the sensor measurements can include temperature and pad life time.

The tool model can be updated periodically or as needed based on confidence levels and determined model accuracy. For example, device characteristics that deviate beyond a threshold amount from predicted characteristics could initiate an update of the tool model.

In one embodiment, the present disclosure includes a process tool system that utilizes tool sensor data and a tool model to facilitate semiconductor fabrication. The process tool system includes a sensor data component, the tool model, and an execution system. The sensor data component is configured to provide the tool sensor data. The tool model is configured to generate model outputs based on model inputs. The manufacturing execution system is configured to provide tool process data, including actual metrology and previous process data, to the sensor data component. Additionally, the execution system provides the model inputs to the tool model and receives the model outputs from the tool model. The execution system provides one or more execution system outputs based on the sensor data and the model outputs. The sensor data, in one example, includes measured semiconductor device characteristics.

In another embodiment, the present disclosure includes a process tool system that utilizes tool sensor data and a tool model to facilitate semiconductor fabrication. The system includes one or more tool models, tool sensors, and an execution system. The tool models are correlated to one or more semiconductor process steps. Further, the tool models are configured to generated model outputs based on model inputs. The tool sensors obtain sensor measurements for semiconductor device characteristics. The execution system is configured to generate the one or more tool models based on the sensor measurement and tool behavior.

In another embodiment, the present disclosure includes a method for operating a process tool. A tool model is generated for a semiconductor fabrication step based on a layout and design specifications and tool behavior. Model inputs are provided to the tool model. Model outputs are generated from the tool model. The model outputs include predicted device features. The semiconductor fabrication step is performed utilizing the model outputs. Sensor measurements are obtained for the semiconductor fabrication step.

It will be appreciated that while reference is made throughout this document to exemplary structures in discussing aspects of methodologies described herein (e.g., the structure presented in FIGS. 1-3, while discussing the methodology set forth in FIG. 4), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A process tool system comprising:
    a tool sensor built-in to a process tool and configured to provide tool sensor data;
    a tool model built-in to the process tool, wherein the tool model is configured to generate model outputs based on model inputs;
    an execution system configured to:
        provide tool process data to the inputs of the tool model; and
        provide one or more execution system outputs based on the model outputs and the tool sensor data.

2. The system of claim 1, wherein the tool process data includes actual metrology and previous process data.

3. The system of claim 1, wherein the sensor data includes measured tool behavior data.

4. The system of claim 1, wherein the model outputs include predicted fabrication characteristics or a confidence level.

5. The system of claim 1, wherein the model incorporates specific behavior of the process tool in generating the model outputs.

6. The system of claim 5, wherein the specific behavior includes sensitivity to one or more of temperature and pressure.

7. The system of claim 1, wherein the model outputs include etch time and etch material concentration and the model inputs include a selected etch amount for a fabrication step.

8. The system of claim 1, wherein the execution system is further configured to:
    update the tool model based on the tool sensor data.

9. The system of claim 1, wherein the execution system outputs include a model accuracy report that indicates an accuracy of the tool model based at least partially on the model outputs from the tool model.

10. The system of claim 1, wherein the execution system outputs include a yield prediction output that indicates a predicted yield based on the sensor data and the model outputs.

11. The system of claim 1, wherein the execution system outputs include a tool matching output that indicates one or more process tools of a plurality of process tools, including the process tool, that match selected semiconductor device characteristics based at least partially on the model outputs and the sensor data.

12. The process tool system according to claim 1, further including:
    a second tool model built-in to a second process tool, wherein the second tool model is configured to generate second model outputs based on second model inputs;
    a second tool sensor built-in to the second process tool and configured to provide second sensor data to the second model inputs of the second tool model; and
    wherein the execution system is further configured to:
        provide second tool process data to the second model inputs of the second tool model; and
        provide the one or more execution system outputs based on both the model outputs and the second model outputs.

13. A process tool system comprising:
    a tool model built-in to a process tool, wherein the tool model corresponds to a semiconductor process step and is configured to generate model outputs based on model inputs;
    a tool sensor built-in to the process tool, wherein the tool sensor is configured to obtain sensor measurements for semiconductor device characteristics; and
    an execution system configured to develop the tool model based on the sensor measurements and behavior specific to the process tool.

14. The system of claim 13, wherein the execution system is further configured to improve the one or more tool models based on the sensor measurements.

15. The system of claim 13, wherein the execution system is further configured to identify the one or more tool models as unreliable.

16. A method of operating a process tool system, the method comprising:

generating a tool model specific and built-in to a process tool based on a layout, design specifications and tool behavior;

providing model inputs to the tool model for a semiconductor fabrication step, the model inputs including metrology and previous process data for a semiconductor device;

generating model outputs from the tool model, the model outputs including predicted device features and predicted wafer process performance data;

performing the semiconductor fabrication step on the semiconductor device utilizing the model outputs;

obtaining sensor measurements for the semiconductor fabrication step from a tool sensor specific and built-in to the process tool; and generating a system output from the sensor measurements and the model outputs.

17. The method of claim 16, wherein generating the system output further comprising performing fault detection and classification from the sensor measurements and the model outputs.

18. The method of claim 16, wherein the predicted features include dopant concentration profiles.

19. The method of claim 16, wherein obtaining the sensor measurements occurs before, during, and after performance of the semiconductor fabrication step.

20. The method of claim 16, further including:

for each semiconductor fabrication step of the semiconductor device:

providing model inputs to a tool model corresponding to the each semiconductor fabrication step, the tool model of the each semiconductor fabrication step being specific to and built-in to a process tool;

generating model outputs from the tool model of the each semiconductor fabrication step, the model outputs of the tool model of the each semiconductor fabrication step including predicted device features and predicted wafer process performance data;

performing the each semiconductor fabrication step on the semiconductor device utilizing the model outputs of the tool model of the each semiconductor fabrication step; and obtaining sensor measurements for the each semiconductor fabrication step from a tool sensor being specific to and built-in to the process tool of the each semiconductor fabrication step.

* * * * *